US008107564B2

(12) United States Patent
Ruprich

(10) Patent No.: US 8,107,564 B2
(45) Date of Patent: Jan. 31, 2012

(54) DEVICE FOR DETECTING A FREQUENCY OFFSET

(75) Inventor: Thomas Ruprich, München (DE)

(73) Assignee: Infineon Technologies AG (DE)

( * ) Notice: Subject to any disclaimer, the term of this patent is extended or adjusted under 35 U.S.C. 154(b) by 1296 days.

(21) Appl. No.: 11/626,993

(22) Filed: Jan. 25, 2007

(65) Prior Publication Data

US 2007/0177691 A1 Aug. 2, 2007

(30) Foreign Application Priority Data

Jan. 26, 2006 (DE) .......................... 10 2006 003 834

(51) Int. Cl.
*H04L 27/06* (2006.01)
*H03D 1/00* (2006.01)
(52) U.S. Cl. ........................................ 375/343; 375/340
(58) Field of Classification Search .................. 375/130, 375/136, 147, 152, 316, 322, 324, 340, 343
See application file for complete search history.

(56) References Cited

U.S. PATENT DOCUMENTS

| 3,603,996 | A | * | 9/1971 | Murchison et al. | ............. 342/28 |
| 5,048,054 | A | * | 9/1991 | Eyuboglu et al. | ............. 375/222 |
| 2005/0083797 | A1 | * | 4/2005 | Shigeeda et al. | ................ 369/43 |
| 2006/0017856 | A1 | * | 1/2006 | Sheng et al. | ................... 348/725 |

OTHER PUBLICATIONS

Mengali et al. "Synchronization Techniques for Digital Receivers" Plenum Press (pp. 104-133), 1997.
Bradaric et al. "Blind Estimation of the Carrier Frequency Offset in OFDM Systems" 4th IEEE Workshop on Signal Processing, Advances in Wireless Communications (pp. 590-594), 2003.

* cited by examiner

*Primary Examiner* — Young T. Tse
(74) *Attorney, Agent, or Firm* — Dickstein Shapiro LLP

(57) ABSTRACT

A device detects a frequency offset by a frequency converter arranged to convert a received signal into a sideband and comprises a calculator arranged to calculate a characteristic quantity of the sideband which is a measure of the frequency offset.

27 Claims, 6 Drawing Sheets

DEVICE FOR DETECTING A FREQUENCY OFFSET

RELATED APPLICATION

This application claims priority from German Patent Application No. DE 10 2006 003 834.7, which was filed on Jan. 26, 2006, and is incorporated herein by reference in its entirety.

TECHNICAL FIELD

The present invention relates to the field of telecommunication, and, in particular, to the field of frequency offset estimation.

BACKGROUND

Before setting up a data link to one or more base stations (BTS), every mobile radio receiver must synchronize itself to the transmit and receive clock. In CDMA transmission methods, in particular, the most accurate possible and early (early means at the beginning of the initial synchronization process, if possible) frequency synchronization is necessary since frequency deviations in the receive clock cause a significant degradation in the demodulation of the spread spectrum coded signals.

One of the essential performance criteria of a synchronization device are the detection probabilities, the mean acquisition time, the so-called false alarm rate and time needed by the system for detecting a "negative detection". To ensure optimum synchronization performance, the transmitter and receiver must operate frequency-synchronously as accurately as possible. If the mobile radio receiver is already synchronized with a base station, the frequency with respect to new cells to be found is negligible as a rule (e.g. <0.1 ppm in the case of UMTS). For initial synchronization attempts (e.g. after "power on"), in contrast, considerable frequency offsets must be expected between transmitter (BTS) and receiver (mobile terminals) (e.g. 3 ppm). A correction of the frequency offset before or during a very early phase of a synchronization procedure is therefore desirable and advantageous.

In spread spectrum code modulated transmission systems, frequency synchronization and frequency tracking are performed, as a rule, on a basis of received symbols of a pilot channel. For this purpose the pilot channel is demodulated (de-spread) and the phase difference between successive received signals is determined. The method is "state of the art" and can be looked up in detail in the relevant technical literature. This standard method has some disadvantages. On the one hand, it is necessary that the reference channel (pilot channel) transmits a sufficiently long sequence of contiguous successive symbols. In the UMTS system, for example, not all channels meet this criterion (e.g. the synchronization channel SCH only transmits one pilot symbol per UMTS slot, i.e. a symbol period of about 0.66 ms). On the other hand, the demodulation sequence (especially the spread spectrum sequence in this case) of the pilot channel is not known, as a rule, in the receiver during the initial synchronization procedure. It is only determined during the initial synchronization procedure or cell detection, respectively. Thus, a standard method cannot perform a correction of the frequency offset in this mode of operation. In consequence, all stages of an initial synchronization procedure (an initial synchronization consists, as a rule, of a number of stages which use/demodulate different channels) must be performed with a frequency offset which, as a rule, is high.

SUMMARY

According to an embodiment, a device for detecting a frequency offset of an input signal may comprise a frequency converter for converting a received signal into a sideband with a predetermined center frequency in order to obtain a sideband signal; and a calculator arranged to calculate a characteristic quantity of the sideband signal from the sideband signal, the characteristic quantity being a measure of the frequency offset.

BRIEF DESCRIPTION OF THE DRAWINGS

Further illustrative embodiments of the present invention will be explained in the text which follows, referring to the attached drawings, in which.

DETAILED DESCRIPTION

Figure 1:
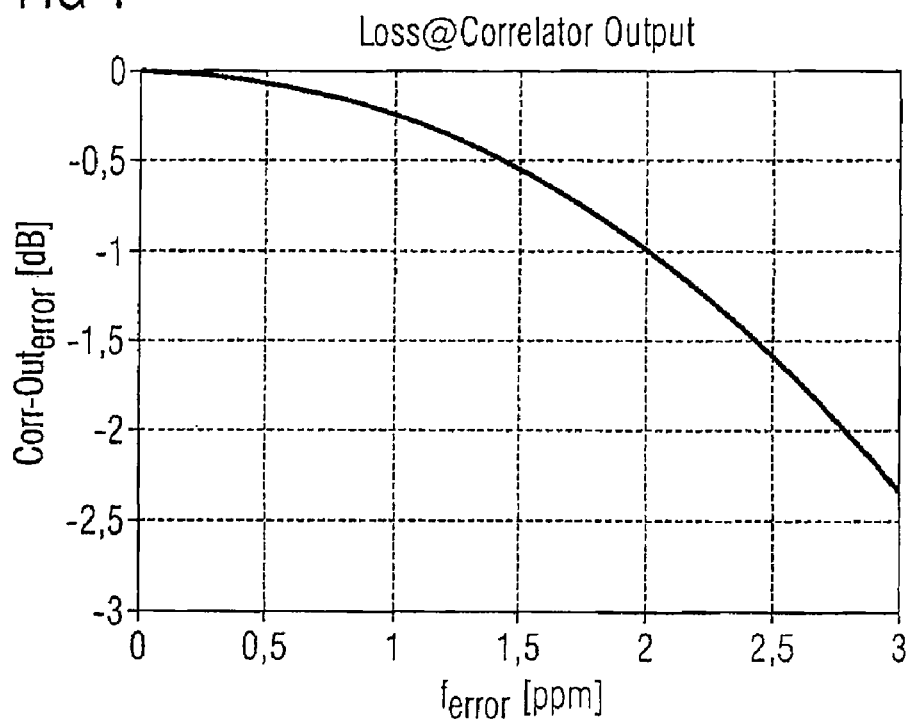
FIG. 1 shows a power loss of correlator output in dependence on the frequency offset.

The frequency offset can be detected on the basis of the characteristics of the same signal after its shift into different side bands, e.g. by frequency conversion.

According to an embodiment, a device detects a frequency offset by means of a frequency converter which is arranged for converting a received signal into a side band with a predetermined centre frequency so that a frequency-converted side band signal is produced. If the received signal is, for example, a baseband signal, the frequency converter converts the baseband signal so that the spectrum of the sideband signal is displaced with respect to the spectrum of the received signal in the frequency band. The frequency shift can be both positive and negative.

According to an embodiment, the device also may comprises a calculating means which derives in the sideband a quantity characteristic of the sideband. For example, the calculating means determines the energy or the absolute value average or the power of the sideband signal. The quantity characteristic of the sideband is already a measure of the frequency offset. If the characteristic quantity is, for example, the energy of the sideband signal, the energy which can be different for different centre frequencies already provides information on the frequency offset. It is thus possible to infer the frequency offset on the basis of the characteristic quantity.

According to an embodiment, for the detection of the frequency offset, the device can comprise a detector which detects the frequency offset on the basis of the characteristic quantity. For this purpose, the detector can compare the characteristic quantity, for example, with a prestored value in order to determine the frequency offset. If the prestored value is allocated to a frequency offset value and if the characteristic quantity corresponds to the prestored value, the frequency offset value can be output directly. For the detection of the frequency offset, the detector can compare the characteristic quantity with a plurality of prestored values, a frequency value being allocated to each prestored value. The detector may preferably output the frequency offset value which is allocated to the prestored value to which the characteristic quantity corresponds most readily.

According to an embodiment, the plurality of prestored values can be prestored, for example, in a memory comprised by the device.

According to an embodiment, the prestored values can be determined, for example on the basis of simulations. For this purpose, a characteristic quantity is determined for each possible frequency offset. The characteristic quantities are then stored as prestored values in the memory. If a characteristic quantity is determined in operation, the frequency offset to be expected can be determined directly on the basis of the comparison. To obtain a finer resolution, the detector can be arranged for performing an interpolation between the prestored values in order to obtain intermediate values.

According to an embodiment, the frequency converter can generate a plurality of signals, each signal having a different predetermined centre frequency. For example, the frequency converter generates a plurality of copies of the copies of the received signal and converts the plurality of the received signal into different sidebands having different centre frequencies in order to obtain a plurality of sideband signals. The calculating means can then derive a plurality of characteristic quantities from the plurality of converted sideband signals and possibly from the unconverted received signal, the detector deriving the frequency offset, for example, by comparison with a plurality of prestored values, on the basis of the plurality of the characteristic quantities. In this process, each of the characteristic quantities is characteristic of the respective signal. The characteristic quantities can be energies of the sideband signal, its powers or its absolute value averages.

According to an embodiment, however, the calculating means can combine the plurality of characteristic quantities with one another in order to obtain a combination, wherein the combination of the plurality of characteristic quantities is already a measure of the frequency offset at the receiving end.

For example, according to an embodiment, the calculating means may calculate a plurality of ratios of the characteristic quantities, wherein a ratio of two characteristic quantities is determined in each case. The combination which indicates the frequency offset can be determined, for example, by a difference or by a sum of the ratios. The detector can determine the frequency offset on the basis of a comparison of a combination with prestored values. However, the combination can be calculated on the basis of the difference or the sum of all characteristic quantities.

According to an embodiment, the frequency converter can output, e.g. a further signal, the spectrum of which has a further predetermined centre frequency, wherein the further predetermined centre frequency differs from the predetermined centre frequency of the sideband signal. Both frequencies, i.e. the predetermined centre frequency and the further predetermined centre frequency are predetermined. The further signal with the further predetermined centre frequency can be the received signal itself which is output as a further signal.

However, according to an embodiment, the frequency converter can generate a further sideband signal, the centre frequency of which differs from zero. The predetermined centre frequency and the further predetermined centre frequency are different and are, for example, 1 kHz or 2 kHz.

According to an embodiment, the calculating means in each case calculates a characteristic quantity on the basis of the sideband signal and the further signal which can be the received signal or a sideband signal. The respective characteristic quantity can be the energy of the respective signal, its absolute value average or its power.

If the characteristic quantities are energies or powers, according to an embodiment, the calculating means may calculate these on the basis of the expected values of the square of the absolute values of the samples of the respective signal. For this purpose, the calculating means adds together, for example, a plurality of squared absolute values of the samples of the respective signal in order to estimate its energy as the characteristic quantity. If, in contrast, the power is to be determined, the calculating means scales the energy by a time value. If the characteristic quantities are absolute value averages, the calculating means adds together the absolute values of the samples of the respective signal in order to determine the respective characteristic quantity.

The characteristic quantities are already a measure of the frequency offset. To provide more accurate information about the frequency offset, according to an embodiment, the calculating means can combine the characteristic quantities with one another in order to obtain a combination which is also a measure of the frequency offset. To calculate the combination, the calculating means can determine, for example a ratio of the characteristic quantities or a difference of the characteristic quantities or a sum of the characteristic quantities.

According to an embodiment, the calculating means can also be arranged for determining a first ratio, for example between the characteristic quantity and the further characteristic quantity, and for determining a second ratio, for example, between the further characteristic quantity and the characteristic quantity, and for combining the first and the second ratio, for example, with one another by means of addition or subtraction.

As described above, the detector can determine the frequency offset on the basis of a comparison of the combination with one or with a plurality of prestored values. According to an embodiment, the prestored values can be determined in advance (for example on the basis of measurements or of simulations) and stored in a memory.

According to a further embodiment, the detector can calculate the frequency offset by inserting the combination into a mathematical function which unambiguously maps the combination on to the frequency offset. Such a mathematical function can be obtained, for example, by a polynomial approximation of the prestored values so that different frequency offsets can be determined for any combination values and also for intermediate combination values.

According to an embodiment, the combination which is a measure of the frequency offset can be used for controlling a controlled oscillator so that the frequency offset at the receiving end is minimized by frequency tracking on the basis of the combination.

According to an embodiment, the device may comprise a controlled oscillator which is controlled by the calculating means so that an oscillator frequency is controlled on the basis of the combination. The combination can be output, directly as a voltage value, for example which can be used directly for controlling, for example, a voltage-controlled oscillator.

According to an embodiment, the device for detecting the frequency offset can also have a filter which precedes the frequency converter and which converts a filter input signal into the received signal. According to an embodiment, the filter can be covered by the frequency converter. The filter can be arranged as a matched filter.

According to an embodiment, the filter can perform a correlation between the filter input signal and a demodulation sequence in order to obtain the received signal. The demodulation sequence can be, for example, a spread spectrum sequence which is used for de-spreading at the receiving end. Spread spectrum sequences are used, for example, in spread spectrum systems such as CDMA. According to an embodiment, the demodulation sequence can be any orthogonal sequence which matches an orthogonal modulation sequence used at the transmitter end, so that, during the correlation at the receiving end, the signal components exhibiting corresponding modulation sequences from the transmitter end are extracted from the input signal. Orthogonal modulation sequences are used, for example, in orthogonal modulation methods.

According to an embodiment, to perform the correlation, the filter is arranged for multiplying the demodulation sequence (for example, the spread spectrum sequence) and the input signal coefficient by coefficient (possibly performing a conjugation of the input signal or of the demodulation sequence, respectively) and for adding together the results of the multiplications in order to obtain the received signal or its sample.

According to an embodiment, the filter can be provided for performing at the same time, during the filtering, a frequency conversion into the sideband in order to obtain the sideband signal. For this purpose, the demodulation signal (for example the spread spectrum sequence or the orthogonal sequence) can already contain a frequency conversion sequence with the aid of which the frequency conversion is performed. According to an embodiment, the frequency conversion sequence can be, for example, a sequence of coefficients of a sinusoidal or a cosinusoidal oscillation having the desired centre frequency. According to an embodiment, the frequency conversion sequence can also be a complex-valued sequence, the coefficients of which are samples of the Gaussian e-function with a complex-valued exponent.

According to an embodiment, the frequency converter can have a multiplier in order to multiply the input signal or the received signal by the frequency conversion sequence in order to obtain the sideband.

According to a further embodiment, a receiver may have the device described above and a controlled oscillator. The device is used for determining a frequency offset which is possessed by the oscillator frequency and in order to control the oscillator in such a manner that the frequency offset is minimized.

According to different embodiments, an accurate synchronization before the detection of the frequency offset is not necessary because the sequences to be converted into the sideband or into the sidebands can be any sequences. In addition, no separate training sequences are needed for detecting the frequency offset. Furthermore, PLL circuits, tracking, for example an oscillator frequency can also be omitted because, according to different embodiments, tracking of the oscillator frequency can be performed on the basis of the combination described above or even also on the basis of the quantity characteristic of the sideband signal.

According to an embodiment, a method is provided which provides for early frequency synchronization or reduction of the frequency offset of a receiver with respect to a reference frequency of the transmitter. Early means in this case that a correction of the frequency offset already takes place before or during the initial synchronization and cell search process. In contrast to known methods, the method according to an embodiment can be applied to any symbol sequences of a channel so that no sequence of contiguous successive symbols is necessary. The method according to an embodiment can also be applied to any received channels which can be demodulated and is thus independent of the necessary identification of demodulation sequences (e.g. spread spectrum code sequences) of transmitter-related pilot channels. The method according to an embodiment is also advantageous because initial synchronization or cell identification procedures can be performed (at least partially) with significantly reduced frequency offset. For this reason, an improved cell detection performance can also be expected.

As already mentioned, the device according to an embodiment has a filter which is arranged for performing a correlation in which, for example, a filter input signal is correlated with a spread spectrum sequence. At the correlator output, a power loss can then be found in dependence on the frequency offset. FIG. 1 shows, by way of example the power loss at the filter output (Corr-Out$_{ferror}$ in dB) in dependence on the frequency offset $f_{error}$ (in ppm). As can be seen from FIG. 1, a frequency offset of about 2 ppm, can already result in a power loss of 1 dB. The curve shown in FIG. 1 can be created, for example, on the basis of empirical measurements or of simulations, and stored in a memory. The frequency offset can already be derived on the basis of the measurement of the power of the output signal of the filter (of the correlator).

Figure 2:
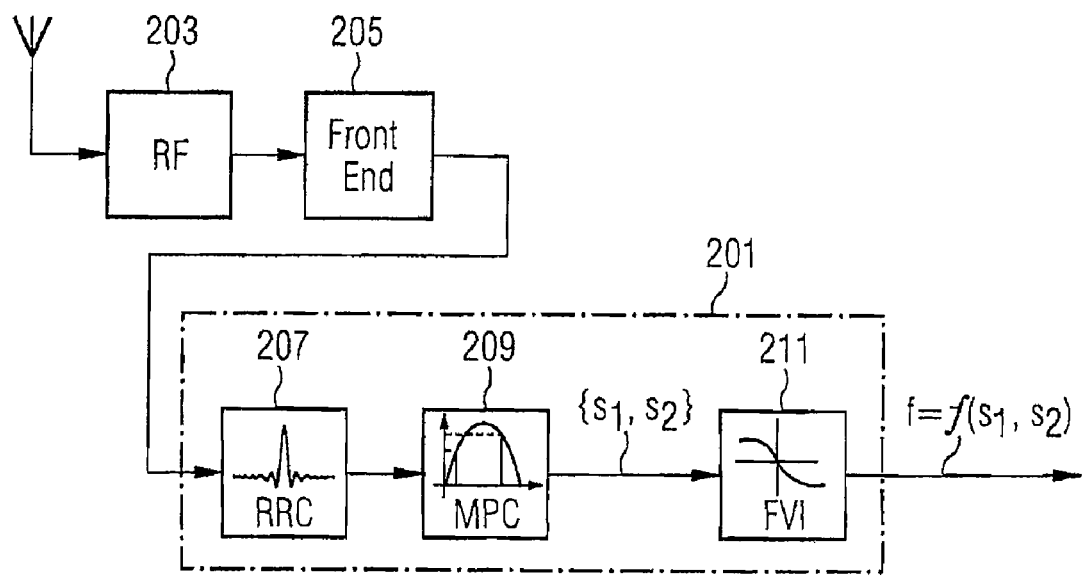
FIG. 2 shows a block diagram for detecting the frequency offset.

FIG. 2 shows a block diagram of a receiving structure of the device according to an embodiment for detecting (for measuring) the frequency offset in the baseband.

The device 201 according to an embodiment follows a radio frequency section 203 and a front end 205. In the radio frequency section 203, for example, a conversion of the signals received via the antenna shown in FIG. 2 into the baseband can be performed. In the front end 205, signal sampling occurs, for example.

The device 201 comprises a filter 207 which can be, for example, a root-raised cosine filter (RRC). The filter 207 is followed by a frequency converter 209 which maps the original baseband signal onto one or multiple sideband signals. The frequency converter 209 can be arranged, for example as a multiphase correlator (MPC). The frequency converter 209 is followed by a calculating means 211 which is arranged, for example as a frequency-variant interpolator (FVI).

As already mentioned, the frequency converter 209 can be provided for performing the baseband mapping of the original baseband signal onto, for example, multiple sideband signals or onto a sideband in the baseband by manipulating the signal phase of the received de-spread signal (called symbol in the text which follows). This can be performed for M frequency phases. The mapping function of the frequency converter 209, which can be arranged as multi-phase correlator, is for example:

$$S_{m,k} = \sum_{i=0}^{N-1} c_i r_{i,k} e^{-j2\pi \Delta f_m T_c i} \quad (1)$$

where $S_{m,k}$ is the symbol, mapped into the mth sideband at the baseband and, at the receiving time k, $r_{i,k}$ is the spread baseband signal received at time k with respect to the code phase i, N is the spreading factor, $c_i$ is the ith element of the demodulation sequence (spreading sequence), $T_c$ is the signal sampling rate and $\Delta f_m$ is the sideband frequency with respect to the original baseband signal (frequency offset).

For the further baseband processing, the M output signals of the frequency converter 209 are fed into the calculating means 211 which, for example, estimates the frequency offset at the receiving end by means of an interpolation of the (M−1)th order. Interpolation approaches are known in the field of digital signal processing.

To generate a suitable error signal which, for example, represents the aforementioned characteristic quantity or the aforementioned combination, various error functions can be used. As an example, reference is made to the following error function S(f) with two sideband phases:

$$S(f) = \frac{E\{s_0^2\}}{E\{s_1^2\}} - \frac{E\{s_1^2\}}{E\{s_0^2\}} \quad (2)$$

where $f=f_{transmitter}-f_{receiver}$ is the frequency offset of the receiver and $E\{s_m^2\}$ is the expected value of the symbol power of the received signal mapped into the mth sideband at the baseband end.

$\Delta f_x$ or $f_x$, where x, for example, stands for "transmitter" or "receiver" are the centre frequencies of the sideband projections. These are parameters of the device according to an embodiment and are not dependent on the frequency offset of the transmitter with respect to the receiver. Instead, establishing the centre frequencies of the sideband projections influences the characteristics of the characteristic quantities and thus of the error signal.

Figure 3:
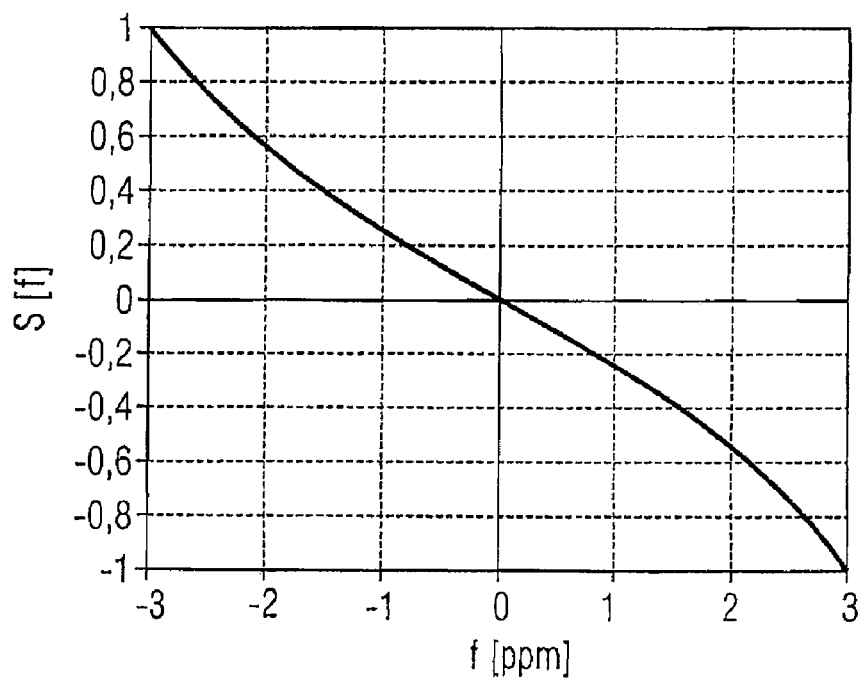
FIG. 3 shows an error signal curve S(f) in dependence on the frequency offset f.

The frequency offset at the receiver end can be derived by calculating the inverse function $S^{-1}(f)$. FIG. 3 shows a graphical interpretation of the formula (2) where S(f) is normalized to max(∥S(f)∥).

The error signal curve shown in FIG. 3 can be determined, for example, in advance empirically or on the basis of simulations and stored in a memory. A detector following the calculating means can divide the frequency offset f by a comparison on the basis of a value for S.

In the text which follows, the concept will be explained with the example of the initial cell search of a UMTS mobile station. The illustrative embodiment described in the text which follows is a simplification which consists of a linear FVI stage and a MPC stage which maps the received spread-spectrum coded signal on the two sidebands at the baseband end.

Figure 4:
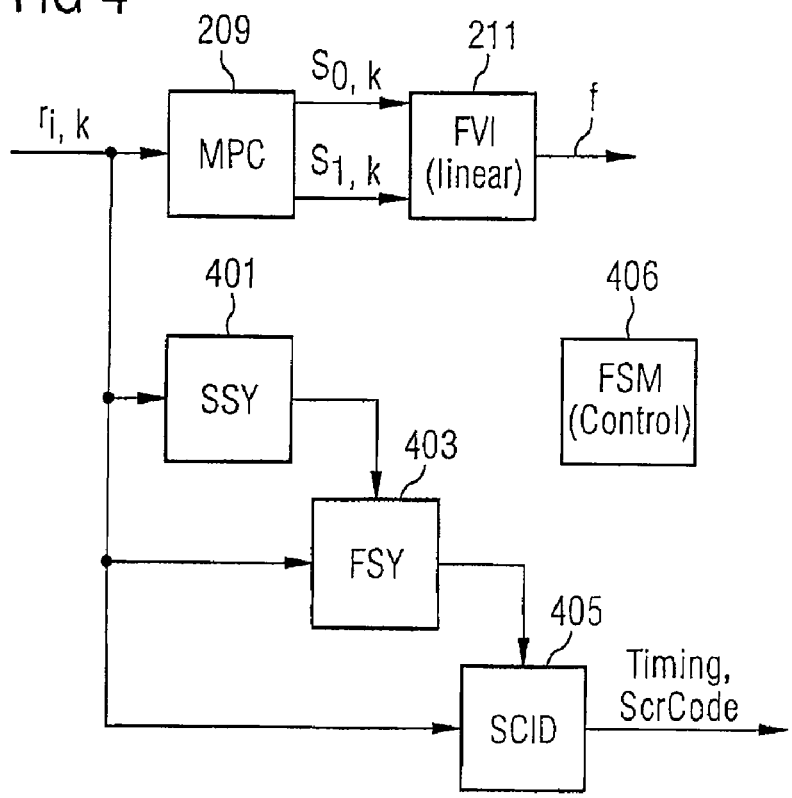
FIG. 4 shows a block diagram for estimating the frequency offset.

FIG. 4 shows a block diagram of the device according to an embodiment for detecting (estimating) the frequency offset on the basis of the demodulation of a spread-spectrum code modulated received signal $r_{i,k}$.

The received signal is supplied to the frequency converter 209 (MPC). The frequency converter 209 supplies the signals $S_{0,k}$ and $S_{1,k}$ which are, for example, characteristic quantities of the various sidebands which are calculated by using formula (1). These characteristic quantities can be output either in parallel or serially. The interpolator 211 (FVI calculating means) following the frequency converter 209 calculates, for example, the combination shown in formula (2) on the basis of the characteristic quantities and compares this combination with values which are prestored and represent the curve represented in FIG. 3 in order to divide the frequency offset f. The detected frequency offset f can be supplied, for example, to a controlled oscillator in order to track the oscillator frequency.

The signal $r_{i,k}$ is supplied in parallel to a slot synchronization block 401 (SSY) and to a frame synchronization block 403 (FSY). An output of the slot synchronization block 401 is connected to a further input of the frame synchronization block 403.

The received signal $r_{i,k}$ is also supplied to the cell detection block (SCID) 405. The block SCID 405 supplies an output signal (timing, SCR code) which, for example is supplied to a cell list. Furthermore, a control unit 406 (FSM; finite state machine) is provided.

Among other things the synchronization channel SCH is received with the signal r, the primary synchronization channel pSCH being demodulated both for the slot synchronization SSY and for the initial frequency estimation. After completed slot synchronization and correction of the frequency offset of the receiving station, the signal r can be supplied to the synchronization stages FSY and SCID. The receiver frequency is corrected by means of a frequency control unit. In comparison with the standard method, the signal processing in the stages FSY and SCID is performed with a distinctively reduced frequency offset of the receiver with respect to the transmitting frequency in a method according to FIG. 4.

Figure 5:
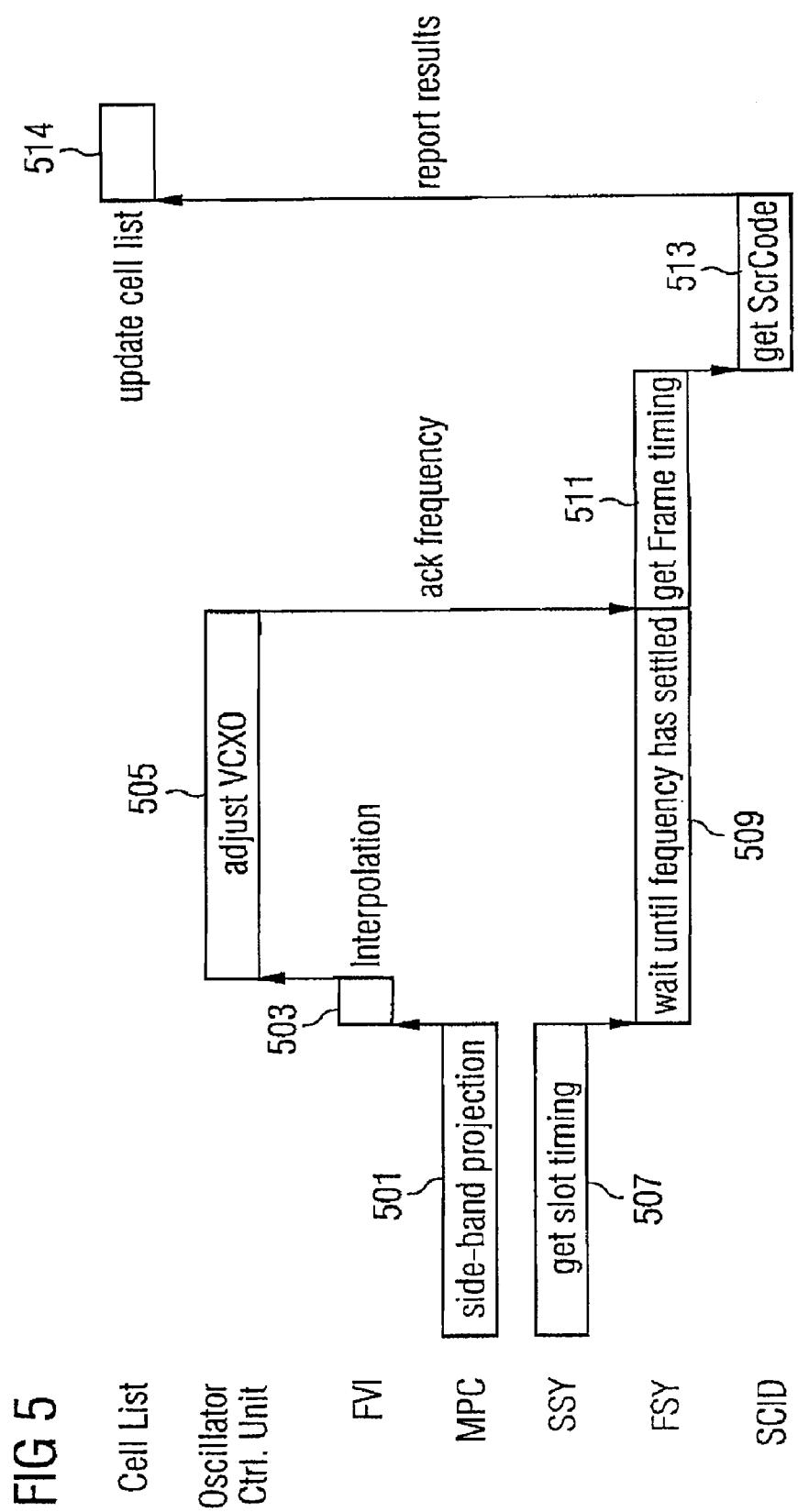
FIG. 5 shows a sequence diagram on an initial cell search of a UMTS mobile station based on the concept according to an embodiment.

FIG. 5 shows a sequence diagram of an initial cell search of an UMTS mobile station, based on the method according to an embodiment. The frequency converter 209 performs the sideband projection 501. The interpolator 201 determines, for example, by interpolation 503, the frequency offset f which is conveyed to an oscillator control unit. Following this, a voltage controlled oscillator (VCXO) for example, is adjusted on the basis of the frequency offset f in step 505. During this process the voltage controlled oscillator outputs a signal (ack frequency) which indicates the frequency setting.

In the meantime, the SSY unit 401 determines the slot synchronization in step 507 (get slot timing). In the meantime, the frame synchronization block 403 waits until the frequency has been set, in step 509. Responding to the "ack frequency" signal, the frame synchronization block 403 determines the frame synchronization in step 511 (get frame timing). After that the SCID unit 405 determines the scrambling code (get scrambling code) in step 513. The results are conveyed to a cell list which updates the cell list in step 514.

Figure 6:
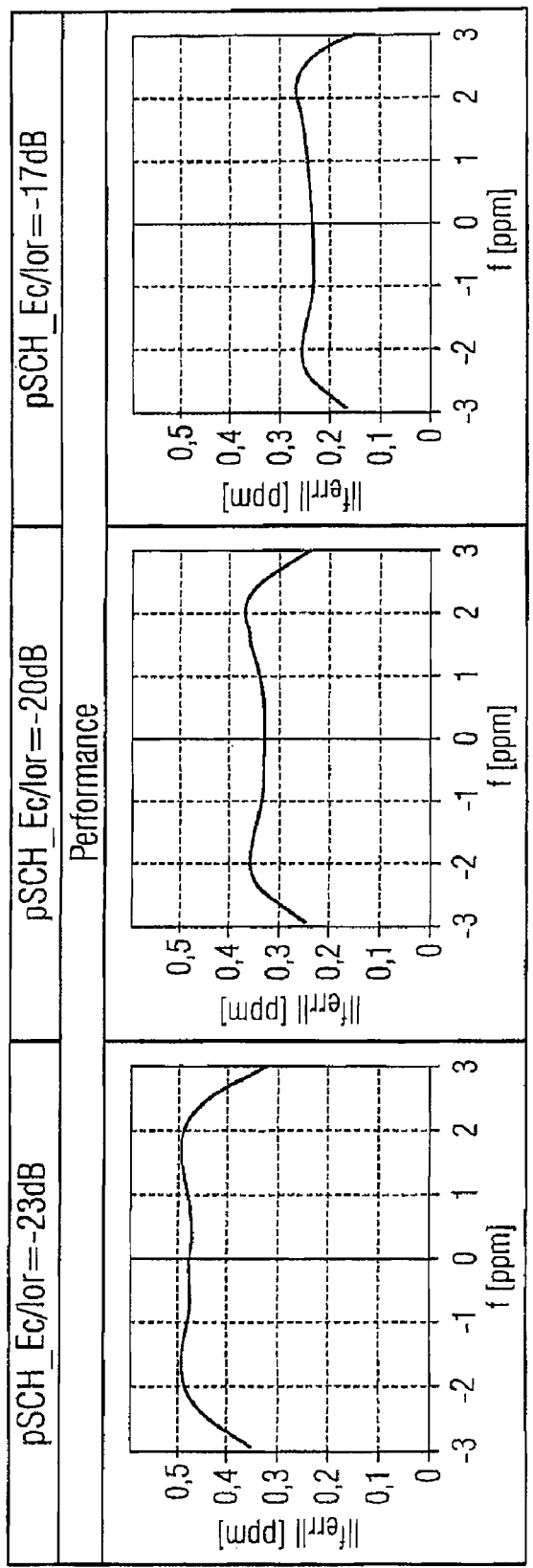
FIG. 6 shows the performance of the concept according to an embodiment.

FIG. 6 illustrates the performance of the concept according to an embodiment by means of simulation results in which the absolute value of the error produced in the detection of the frequency offset $\|f_{error}\|$ (ppm) is plotted against the frequency offset f (ppm).

Figure 7:
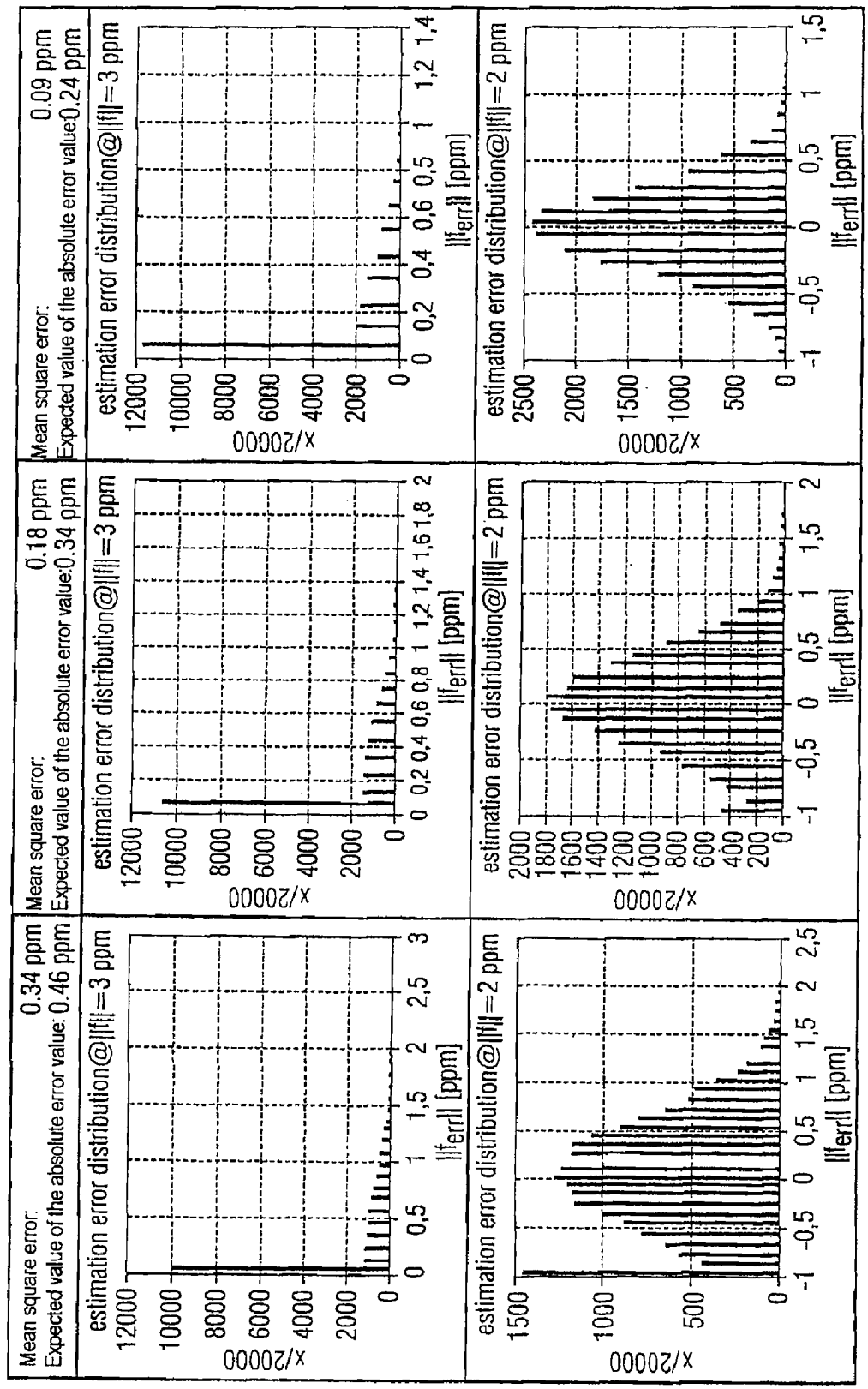
FIG. 7 shows statistical characteristics of the concept according to an embodiment.
Figure 7:
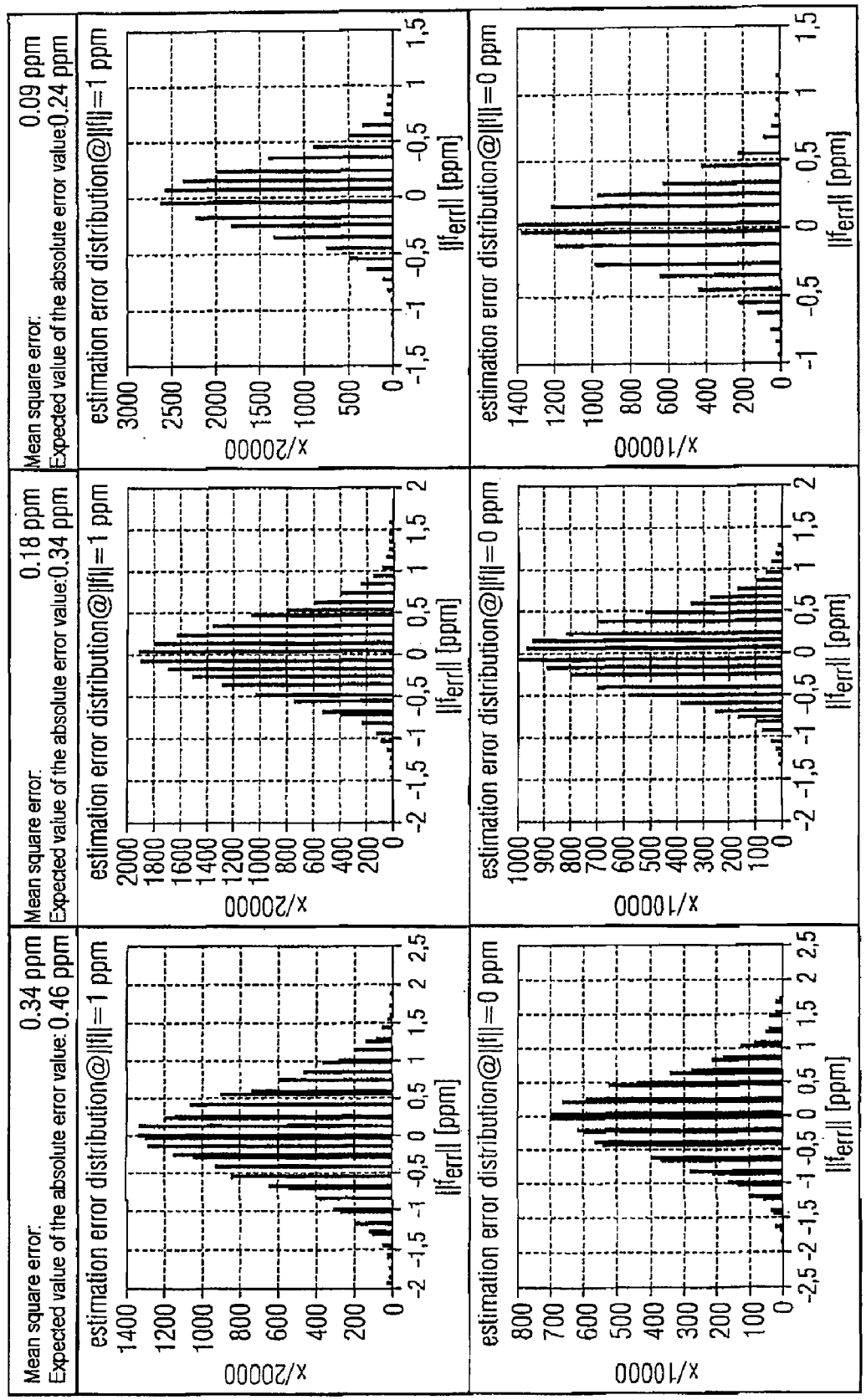

FIG. 7 illustrates the statistical characteristics of the concept according to an embodiment by means of the estimation error distribution for different values of the frequency offset f.

What is claimed is:

1. A device for detecting a frequency offset of a received signal comprising:
   a frequency converter arranged to convert the received signal which is a baseband signal into a sideband with a predetermined center frequency by frequency-shifting the baseband signal into the sideband to obtain a sideband signal; and
   a calculator arranged to calculate a characteristic quantity of the sideband signal from the sideband signal, the characteristic quantity being a measure of the frequency offset.

2. The device according to claim 1, wherein the calculator is arranged to calculate the energy of the sideband signal or to calculate the absolute value average of the sideband signal or to calculate the power of the sideband signal as the characteristic quantity.

3. The device according to claim 1, wherein the calculator is arranged to detect the frequency offset on the basis of the characteristic quantity.

4. The device according to claim 3, wherein the calculator is arranged to compare the characteristic quantity with a prestored value to determine the frequency offset, the prestored value being allocated to a frequency offset value.

5. The device according to claim 1, wherein the frequency converter is arranged to output a further received signal with a further predetermined center frequency, wherein the further predetermined center frequency differs from the predetermined center frequency, and wherein the calculator is arranged to calculate on the further received signal a further characteristic quantity which is characteristic of the further received signal, and to combine the characteristic quantity and the further characteristic quantity to obtain a combination which is the measure of the frequency offset.

6. The device according to claim 5, wherein the frequency converter is arranged to output the received signal as the further received signal or to convert the received signal into a further sideband and to output the further received signal as a further sideband signal thus obtained.

7. The device according to claim 5, wherein the calculator is arranged to determine a ratio of the characteristic quantity and the further characteristic quantity, or to determine a difference of the characteristic quantity and the further characteristic quantity, or to determine a sum of the characteristic quantity and the further characteristic quantity or to determine a difference of a quotient of the characteristic quantity divided by the further characteristic quantity and a further quotient of the further characteristic quantity divided by the characteristic quantity as the combination.

8. The device according to claim 5, wherein the calculator is arranged to determine the frequency offset on the basis of the combination.

9. The device according to claim 8, wherein the calculator is arranged to compare the combination with a prestored value to detect the frequency offset, wherein the prestored value is allocated to a frequency offset value.

10. The device according to claim 5, further comprising a controlled oscillator, wherein the calculator is arranged to control an oscillator frequency of the controlled oscillator on the basis of the combination.

11. The device according to claim 1, further comprising a controlled oscillator, wherein the calculator is arranged to control an oscillator frequency of the controlled oscillator on the basis of the characteristic quantity.

12. The device according to claim 1, further comprising a filter arranged to convert an input signal into the received signal, wherein the input signal is a signal received via an antenna, converted into baseband, and sampled.

13. The device according to claim 12, wherein the filter is a matched filter.

14. The device according to claim 12, wherein the filter is arranged to perform a correlation between the input signal and a demodulation sequence to obtain the received signal.

15. The device according to claim 14, wherein the demodulation sequence is a spread spectrum sequence.

16. The device according to claim 14, wherein the filter is arranged to multiply the demodulation sequence and the input signal, coefficient by coefficient, and to add together the multiplication results.

17. The device according to claim 14, wherein the demodulation sequence includes a frequency conversion sequence so that a conversion into the sideband is performed during the correlation.

18. The device according to claim 1, wherein the frequency converter includes a multiplier arranged to multiply the received signal by a frequency conversion sequence to obtain the sideband signal.

19. A receiver, comprising:
a device comprising a frequency converter arranged to convert a received signal into a sideband with a predetermined center frequency to obtain a sideband signal, and a calculator arranged to calculate a characteristic quantity of the sideband signal from the sideband signal, the characteristic quantity being a measure of a frequency offset; and
a controlled oscillator, wherein
the calculator is arranged to control the controlled oscillator in such a manner that the frequency offset is reduced.

20. A method for detecting a frequency offset of a received signal, comprising:
converting, by a frequency converter, the received signal which is a baseband signal into a sideband with a predetermined center frequency by frequency-shifting the baseband signal into the sideband to obtain a sideband signal; and
calculating, by a calculator, a characteristic quantity of the sideband signal from the sideband signal, wherein the characteristic quantity is a measure of the frequency offset.

21. The method according to claim 20, wherein the energy of the sideband signal or the absolute value average of the sideband signal or the power of the sideband signal is calculated as the characteristic quantity.

22. The method according to claim 20, wherein the characteristic quantity is compared with a prestored value to determine the frequency offset, the prestored value being allocated to a frequency offset value.

23. The method according to claim 20, wherein a further received signal with a further predetermined center frequency is generated, wherein the further predetermined center frequency differs from the predetermined center frequency, wherein a further characteristic quantity which is characteristic of the further received signal is calculated from the further received signal and wherein the characteristic quantity and the further characteristic quantity are combined to obtain a combination which is the measure of the frequency offset.

24. The method according to claim 23, wherein the received signal is output as the further received signal or in which the received signal is converted into a further sideband, wherein a further sideband signal thus obtained is output as the further received signal.

25. The method according to claim 23, wherein a ratio of the characteristic quantity and the further characteristic quantity or a difference between the characteristic quantity and the further characteristic quantity, or a sum of the characteristic quantity and the further characteristic quantity, or a difference of a quotient of the characteristic quantity divided by the further characteristic quantity and of a further quotient of the further characteristic quantity divided by the characteristic quantity is determined as the combination.

26. The method according to claim 25, wherein the combination is compared with a prestored value to detect the frequency offset, wherein the prestored value is allocated to a frequency offset value.

27. A receiving method comprising:
determining a frequency offset by converting a received signal into a sideband with a predetermined center frequency to obtain a sideband signal, and calculating a characteristic quantity of the sideband signal from the sideband signal, wherein the characteristic quantity is a measure of the frequency offset; and
controlling a controlled oscillator on the basis of the frequency offset to reduce the frequency offset.

* * * * *